(12) United States Patent
Daamen et al.

(10) Patent No.: US 9,419,043 B2
(45) Date of Patent: Aug. 16, 2016

(54) INTEGRATED CIRCUIT INCLUDING A DIRECTIONAL LIGHT SENSOR

(71) Applicant: NXP B.V., Eindhoven (NL)

(72) Inventors: Roel Daamen, Herkenbosch (NL); Nebojsa Nenadovic, Wijchen (NL); Erik Jan Lous, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/887,144

(22) Filed: May 3, 2013

(65) Prior Publication Data

US 2014/0203391 A1    Jul. 24, 2014

(30) Foreign Application Priority Data

May 11, 2012   (EP) .................................... 12167644

(51) Int. Cl.
*H01L 27/14* (2006.01)
*H01L 31/02* (2006.01)
*H01L 27/146* (2006.01)
*G01S 3/784* (2006.01)
*H01L 31/0216* (2014.01)
(Continued)

(52) U.S. Cl.
CPC .......... *H01L 27/14643* (2013.01); *G01S 3/781* (2013.01); *G01S 3/784* (2013.01); *H01L 27/1446* (2013.01); *H01L 27/14618* (2013.01); *H01L 27/14683* (2013.01); *H01L 31/02024* (2013.01); *H01L 31/02164* (2013.01); *H01L 2224/4847* (2013.01)

(58) Field of Classification Search
CPC .............. H01L 27/14634; H01L 27/1446; H01L 27/14618; H01L 27/14683; H01L 31/02024; H01L 31/02164
USPC .......................................... 257/443, E31.063
See application file for complete search history.

(56) References Cited

U.S. PATENT DOCUMENTS

| | | | |
|---|---|---|---|
| 4,625,108 A | 11/1986 | Nestel et al. | |
| 4,682,024 A | 7/1987 | Halldorsson et al. | |
| 4,760,436 A | 7/1988 | Yi Zi | |

(Continued)

FOREIGN PATENT DOCUMENTS

| | | | |
|---|---|---|---|
| EP | 2 662 895 A1 | 11/2013 | |
| JP | 62265740 A | * 11/1987 | |

(Continued)

OTHER PUBLICATIONS

Tambo, T. et al. "Search Method of Sun Using Fixed Five Photodiode Sensor", Transactions of the Institute of Electrical Engineers of JP, vol. 129, No. 2, p. 53 (Feb. 1, 2009).

(Continued)

*Primary Examiner* — Ida M Soward

(57) ABSTRACT

An integrated circuit and a method of making the same. The integrated circuit includes a semiconductor substrate having a major surface. The integrated circuit also includes a directional light sensor. The directional light sensor includes a plurality of photodetectors located on the major surface. The directional light sensor also includes one or more barriers, wherein each barrier is positioned to shade one or more of the photodetectors from light incident upon the integrated circuit from a respective direction. The directional light sensor is operable to determine a direction of light incident upon the integrated circuit by comparing an output signal of at least two of the photodetectors.

15 Claims, 10 Drawing Sheets

(51) Int. Cl.
  *G01S 3/781*    (2006.01)
  *H01L 27/144*   (2006.01)

(56) References Cited

U.S. PATENT DOCUMENTS

| | | | |
|---|---|---|---|
| 4,924,285 A * | 5/1990 | Anderson et al. | 257/293 |
| 5,029,251 A | 7/1991 | Sundberg | |
| 5,055,894 A * | 10/1991 | Chan | H01L 21/7605 257/184 |
| 5,391,869 A * | 2/1995 | Ade et al. | 250/227.24 |
| 5,719,670 A * | 2/1998 | Duboz et al. | 356/141.2 |
| 5,767,507 A * | 6/1998 | Unlu et al. | 369/120 |
| 5,994,724 A * | 11/1999 | Morikawa | H01L 31/035281 257/184 |
| 6,081,018 A | 6/2000 | Nakashiba et al. | |
| 6,455,836 B1 | 9/2002 | Hula | |
| 6,521,882 B1 | 2/2003 | Sumiya et al. | |
| 7,838,956 B2 * | 11/2010 | McCarten et al. | 257/447 |
| 8,358,419 B2 * | 1/2013 | Walters | 356/445 |
| 8,704,152 B2 * | 4/2014 | Svajda et al. | 250/221 |
| 8,901,225 B2 * | 12/2014 | Okuda et al. | 524/431 |
| 8,901,480 B2 | 12/2014 | Michiyama et al. | |
| 2005/0045975 A1 * | 3/2005 | Kondo | H01L 27/14618 257/414 |
| 2005/0202579 A1 * | 9/2005 | Huang et al. | 438/22 |
| 2006/0043515 A1 * | 3/2006 | Ford | 257/436 |
| 2007/0290284 A1 | 12/2007 | Shaffer | |
| 2010/0283998 A1 * | 11/2010 | Souchkov | G01J 1/02 356/141.2 |
| 2011/0018007 A1 * | 1/2011 | Kasahara et al. | 257/88 |
| 2012/0049045 A1 * | 3/2012 | Tian | H01L 27/14603 250/208.1 |
| 2013/0026548 A1 * | 1/2013 | McCarten et al. | 257/294 |
| 2013/0037700 A1 | 2/2013 | Michiyama et al. | |
| 2014/0039290 A1 * | 2/2014 | De Graff et al. | 600/377 |
| 2014/0045730 A1 * | 2/2014 | Walters | 506/39 |
| 2014/0149764 A1 * | 5/2014 | Gunther et al. | 713/320 |

FOREIGN PATENT DOCUMENTS

| | | |
|---|---|---|
| WO | 2009/087531 A1 | 7/2009 |
| WO | 2010/041198 A1 | 4/2010 |
| WO | 2011/160130 A2 | 12/2011 |
| WO | 2012/032753 A1 | 3/2012 |

OTHER PUBLICATIONS

Agranov, G. et al. "Pixel continues to Shrink.. Pixel Development for Novel CMOS Image Sensors", Aptina LLL, 4 pgs, retrieved from the internet at: www.imagesensors.org/.../016_paper_agranov_aptina_smallpix.pdf (2008).

Rhodes, H. et al. "The Mass Production of BSI CMOS Image Sensors", OmniVision Technologies, Inc., 6 pgs, retrieved from the internet at: www.imagesensors.org/.../006_paper_rhodes_omnivision_bsi.pdf (2011).

"An Objective Look at FSI and BSI", An Aptina Technology White Paper, 6 pgs, retrieved from the Internet at: www.aptina.com/news/FSI-BSI-WhitePaper.pdf (2011).

Extended European Search Report for Patent Appln. No. 12167644.9 (Feb. 4, 2013).

* cited by examiner

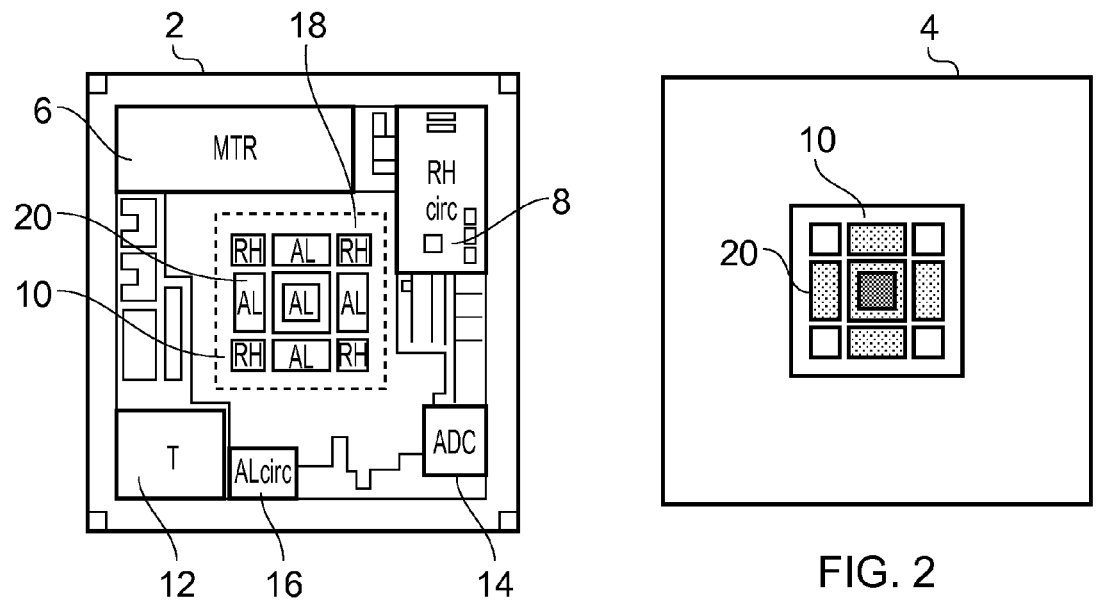
FIG. 1
FIG. 2
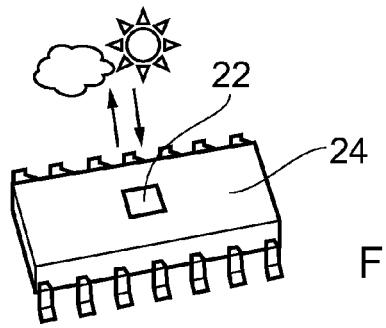
FIG. 3A
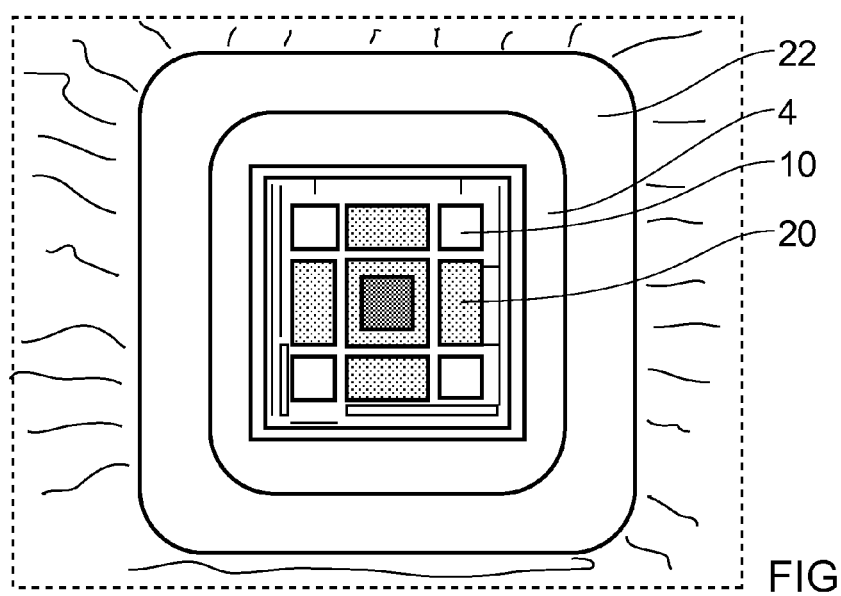
FIG. 3B

INTEGRATED CIRCUIT INCLUDING A DIRECTIONAL LIGHT SENSOR

CROSS-REFERENCE TO RELATED APPLICATIONS

This application claims the priority under 35 U.S.C. §119 of European patent application no. 12167644.9, filed on May 11, 2012, the contents of which are incorporated by reference herein.

BACKGROUND OF THE INVENTION

This invention relates to an integrated circuit. In particular, this invention relates to an integrated circuit including a directional light sensor. The invention further relates to a method of making such an integrated circuit.

Nowadays, integrated circuits may comprise a plethora of different sensors, such as ambient light (AL) sensors, temperature (T) sensors, gas sensors, relative humidity (RH) sensors, specific analyte detection sensors, and so on.

Integrated circuits of this kind have a wide range of applications. For example, they can be used in the field of supply chain management to track and monitor the freshness of food and beverages. They can also be used as environmental sensors, for example as part of a heating, ventilation and air conditioning (HVAC) system in an automobile or in a building (e.g. a Smart Building). Additional applications include those in agricultural (e.g. the sensing of environmental conditions in greenhouses) or in medical fields. Their provision in mobile communications devices such as mobile telephones, tablets or laptops can also enable a wide range of further applications that require measurements of local environmental factors.

The provision of sensors in integrated circuits of this kind allows devices to be produced that have a small form factor, and which can be manufactured cheaply in large numbers using established semiconductor processing techniques.

Due to their small form factor, integrated circuits of this kind can easily be included in Radio Frequency Identification (RFID) tags, allowing for easy programming and readout.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an integrated circuit. The integrated circuit includes a semiconductor substrate having a major surface. The integrated circuit also includes a directional light sensor. The directional light sensor includes a plurality of photodetectors located on the major surface. The directional light sensor also includes one or more barriers, wherein each barrier is positioned to shade one or more of the photodetectors from light incident upon the integrated circuit from a respective direction. The directional light sensor is operable to determine a direction of light incident upon the integrated circuit by comparing an output signal of at least two of the photodetectors.

According to another aspect of the invention, there is provided a method of making an integrated circuit. The method includes providing a semiconductor substrate having a major surface. The method also includes providing a directional light sensor in the integrated circuit by forming a plurality of photodetectors on the major surface; and forming one or more barriers, wherein each barrier is positioned to shade one or more of the photodetectors from light incident upon the integrated circuit from a respective direction. The directional light sensor is operable to determine a direction of light incident upon the integrated circuit by comparing an output signal of at least two of the photodetectors.

The provision of one or more barriers in the integrated circuit, each barrier being positioned to shade one or more of the photodetectors from light incident upon the integrated circuit from a respective direction, can allow the photodetectors to operate as a directional light sensor.

According to one embodiment of the invention, an encapsulant can be provided that covers the major surface. The encapsulant can have an opening therein, which exposes a region of the major surface in which the directional light sensor is provided. This can allow light from the environment surrounding the integrated circuit to reach the directional light sensor.

Conveniently, in accordance with an embodiment of the invention, one or more of the barriers can be formed by the edges of the opening in the encapsulant. For example, at least some of the photodetectors can be positioned beneath the edges of the opening in the encapsulant, so that those photodetectors are located partially beneath the encapsulant.

In accordance with an embodiment of the invention, at least some of the barriers can be formed from the metal features of a metallization stack on the substrate. Since the formation of metallization stacks on integrated circuits is a well developed and controllable technique, this approach allows a high degree of configurability (e.g. size, shape, location) of the barriers.

For example, one or more of the barriers can comprise substantially vertical walls formed from the metal features in the stack. In another example, one or more of the barriers can comprise a patterned metal layer overlying the photodetectors on the major surface. A plurality of such patterned metal layers can be provided. These layers can, for example, be provided in different levels of the metallization stack.

It is envisaged that the approaches to barrier formation described above can, in some embodiments, be combined.

The photodetectors can be arranged in a regular array comprising a central photodetector surrounded by a plurality of further photodetectors. The number and position of the photodetectors surrounding the central photodetector can be varied to tune the angular sensitivity of the directional light sensor.

In one embodiment, the further photodetectors can have a smaller surface than the central photodetector. This saves space on the major surface of the substrate and also makes the photodetectors more susceptible to shadowing by the barriers, thereby increasing the angular sensitivity of the device.

The integrated circuit can include non-volatile memory. At least one of the barriers can act to shade the non-volatile memory from light incident upon the integrated circuit. This can allow the non-volatile memory to be located closer to the opening in the encapsulant while still shielding it from light falling on the integrated circuit. This allows a reduction in the size of the substrate.

A wide range of applications are envisaged.

According to a further aspect of the invention, there can be provided a Radio Frequency Identification (RFID) Tag including an integrated circuit of the kind described above.

According to another aspect of the invention, there can be provided a mobile communications device including an integrated circuit of the kind described above. Examples of mobile communications devices include mobile telephones, tablets and laptops. This can enable a wide range of further applications that require measurements of local environmental factors.

According to a further aspect of the invention, there can be provided a heating, ventilation and air conditioning (HVAC) system including one or more integrated circuits of the kind described above. The HVAC can, for example, be provided in an automobile or in a building (e.g. a Smart Building).

Other applications can include use in the field of supply chain management to track and monitor the freshness of food and beverages. Additional applications include those in agricultural (e.g. the sensing of environmental conditions in greenhouses) or in medical fields.

BRIEF DESCRIPTION OF THE DRAWINGS

Embodiments of the present invention will be described hereinafter, by way of example only, with reference to the accompanying drawings in which like reference signs relate to like elements and in which:

FIG. 1 shows an integrated circuit incorporating a number of different kinds of sensor;

FIG. 2 shows the integrated circuit of FIG. 1 encapsulated in an encapsulant;

FIGS. 3A and 3B shows an open cavity package for use with an integrated circuit of the kind shown in FIGS. 1 and 2;

DETAILED DESCRIPTION

Figure 4:
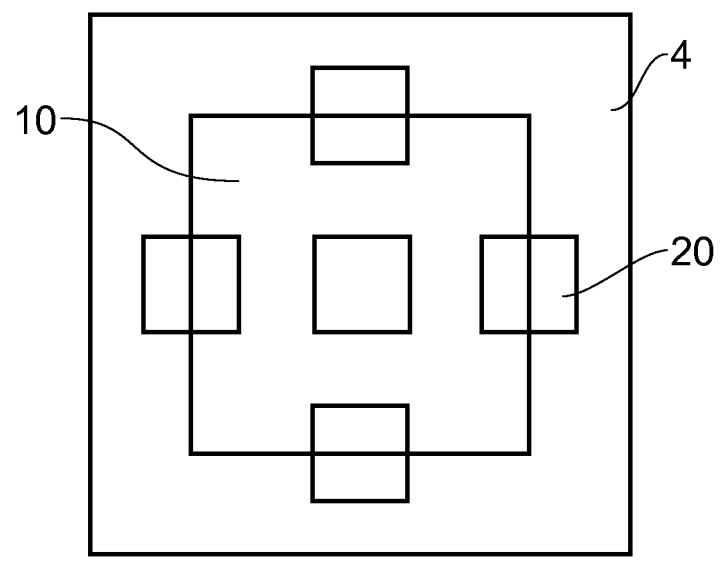
FIG. 4 shows an integrated circuit according to an embodiment of the invention.

Embodiments of the present invention are described in the following with reference to the accompanying drawings.

FIG. 1 shows an example of an integrated circuit incorporating a number of different kinds of sensor. The integrated circuit includes a substrate 2 on which various sensors such as an ambient light (AL) sensor including a plurality of photo-detectors 20, relative humidity (RH) sensors 18 and temperature (T) sensors are located. Various other components and circuitry can also be provided on the substrate 2. In the present example, the integrated circuit includes non-volatile memory 6 (comprising Multiple Time Programmable (MTP) memory), analogue to digital converter (ADC) 14, circuitry 8 for operating the RH sensor(s) 18 and circuitry 16 for operating the ambient light sensor.

In devices of this kind, some of the sensors provided on the integrated circuit require direct access to the surrounding environment. Examples include the ambient light sensors and relative humidity sensors. On the other hand, other kinds of sensor, such as temperature sensors, may not need this access. FIGS. 2 and 3 illustrate how the circuit may be packaged to accommodate these varying requirements.

FIG. 2 illustrates the integrated circuit of FIG. 1, with the addition of an encapsulant 4. The encapsulant 4 can enclose the substrate 2, providing protection for the delicate circuitry therein. It is generally known in the semiconductor industry that an encapsulant can be provided to completely enclose a substrate. However, in the present case, this would be incompatible with the requirement that some of the sensors in the integrated circuit require access to the surrounding environment. Hence, in FIG. 2 it is shown that the encapsulant includes an opening which exposes a region 10 of a major surface of the substrate 2 in which those sensors that require access to the surrounding environment are located. In the present example, those sensors may include the ambient light sensors, and also the relative humidity sensors. On the other hand, comparison of FIG. 1 with FIG. 2 reveals that the encapsulant 4 can still cover other sensors in the device (such as the temperature sensor 12) that do not need to be exposed.

As shown in FIG. 3A, the encapsulated integrated circuit can be mounted in an outer package 24 that also includes an opening 22. FIG. 3B illustrates that the opening 22 in the outer package 24 is located in a position corresponding to the opening in the encapsulant 4, whereby the region 10 of the major surface of the substrate 2 is exposed for detection of light, humidity and/or other environmental factors.

Also located beneath encapsulant 4 are the ADC 14, control circuitry 8 and 16 and the memory 6. Non-volatile memory is sensitive to any exposure of light, and for this reason the memory 6 in this example is typically provided at the edge of the substrate 2, as far away as possible from the opening in the encapsulant 4.

FIG. 4 shows an integrated circuit according to an embodiment of the invention. The integrated circuit includes a semiconductor substrate 2 having a major surface. The integrated circuit also includes a directional light sensor including a plurality of photo-detectors 20 that are located on the major surface of the substrate 2. The photo-detectors 20 can, for example, be arranged in a regular array. In the present example, the array includes a central photo detector surrounded by four peripheral photo-detectors.

The integrated circuit 2 also includes an encapsulant 4, which covers the major surface of the substrate 2, except for the region 10, which corresponds to the region in which one or more sensor types of the integrated circuit can be provided. In particular, in the present example, the photo-detectors 20 are provided in the general vicinity of the region 10. The location, size and shape of the region 10 generally corresponds to the location, size and shape of the opening in the encapsulant 4, whereby sensors provided in the region 10 are provided with appropriate access to the surrounding environment for the sensing of environmental factors such as incident light, humidity, gas presence, etc.

As shown in FIG. 4, at least some of the photo-detectors 20 in the array are, in this example, positioned partially beneath the encapsulant 4. This is illustrated also in FIG. 5 which shows part of the integrated circuit of FIG. 4 in cross-section.

Figure 5:
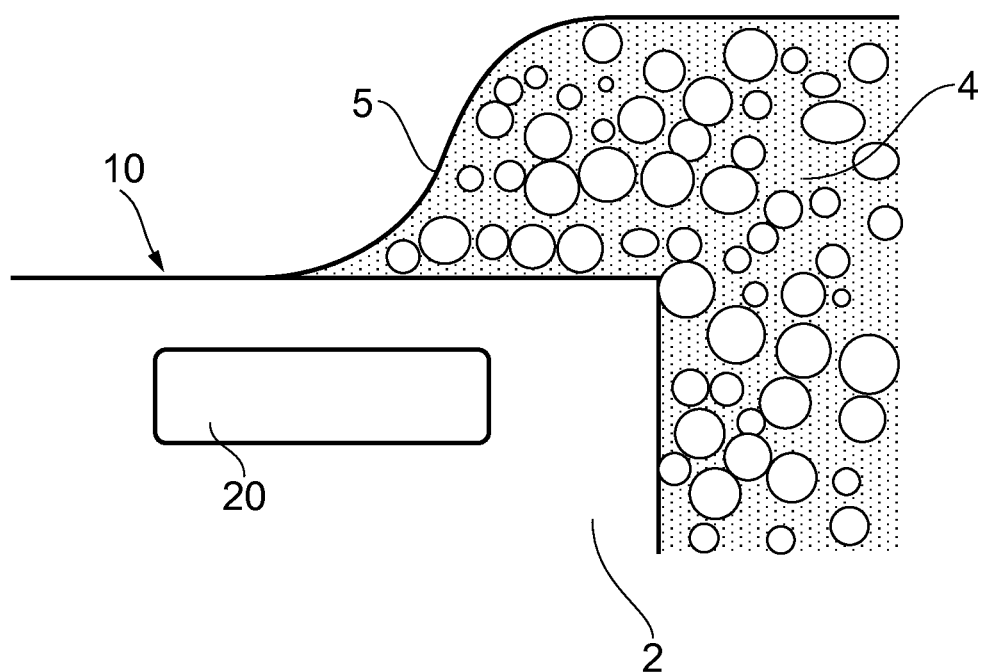
FIG. 5 shows a cross section view of the integrated circuit shown in FIG. 4.

In FIG. 5, it is illustrated that the encapsulant 4 partially encloses the substrate 2 on which the photo-detectors 20 are provided. An opening in the encapsulant 4 allows access to a region 10 on a major surface of the substrate 2 corresponding to the location of one or more sensors of the integrated circuit. The opening in the encapsulant 4 is generally defined by a side wall 5. This side wall 5 may, for example, be an abrupt wall extending vertically from the substrate 2. However, this is not essential and in practice the side wall 5 is likely to exhibit a degree of slope as illustrated in FIG. 5, owing to the material properties of the encapsulant 4 and the manner in which it is deposited on the substrate 2. As illustrated in FIG. 5, the photo-detector 20 is located substantially beneath the side wall 5 whereby the photo-detector 20 lies at least partially beneath the encapsulant 4. On the other hand, at least a portion of the photo-detector 20 does not lie beneath the encapsulant 4 and is thereby directly exposed to incident light falling on the region 10.

The arrangement illustrated in FIGS. 4 and 5 allows the array of photo-detectors 20 to operate as a directional light sensor in a manner which will now be described in more detail with reference to FIG. 6.

Figure 6A:
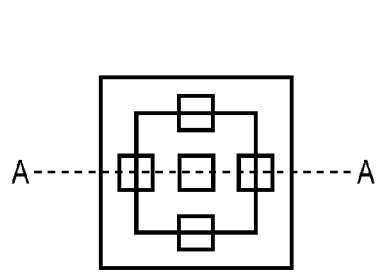
FIGS. 6A, 6B, 6C and 6D illustrate the operation of the directional light sensor in an integrated circuit of the kind shown in FIG. 5.
Figure 6B:
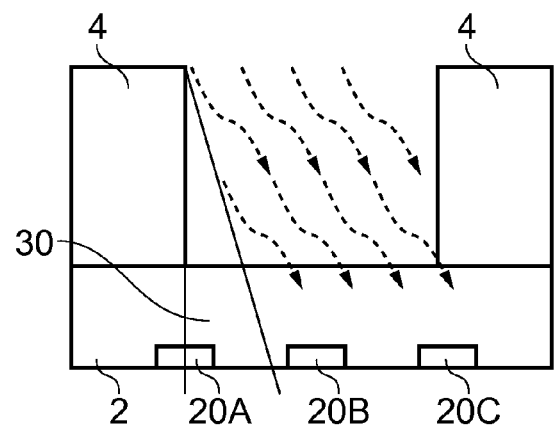
Figure 6C:
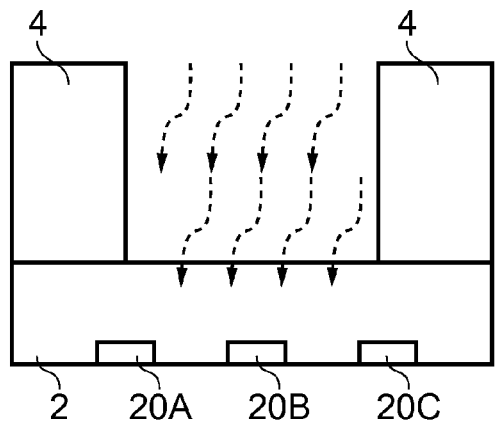
Figure 6D:
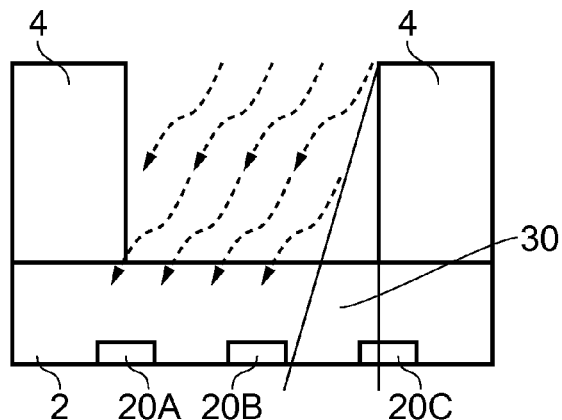

FIG. 6A illustrates schematically an integrated circuit of the kind shown in FIG. 4. The dashed line AA in FIG. 6A illustrates the cross section through the integrated circuit illustrated subsequently in FIGS. 6B, 6C and 6D. As shown in FIGS. 6B, 6C and 6D, the integrated circuit in this example includes a substrate 2 enclosed by an encapsulant 4 that defines an opening through which incident light is able to fall upon an the array of photo-detectors 20. The photo-detectors in this example include photo-detectors 20A, 20B and 20C, where the photo-detector 20B constitutes a central photo-detector and the photo-detectors 20A and 20C are peripheral photo-detectors of the array. The photo-detector 20A is located partially beneath the encapsulant 4 to the left hand side of the opening in the encapsulant 4, while the photo-detector 20C is provided on the opposite side of the opening, and is also located partially beneath the encapsulant 4.

With reference to FIG. 6C, it can be seen that when light is incident upon the integrated circuit from a substantially vertical direction with respect to the major surface, the photo-detectors 20A and 20C receive a substantially equal amount of light. However, when the angle of the light incident upon the integrated circuit is tilted to the left as shown in FIG. 6B, the photo-detector 20A is shaded by the encapsulant 4. The shaded area is illustrated in FIG. 6B as reference numeral 30. Because photo-detector 20C in FIG. 6B receives more light than photo-detector 20A, it is possible to establish that the direction of the light incident on the integrated circuit is indeed tilted to the left. Correspondingly, in FIG. 6D, when the direction of light incident upon the integrated circuit is tilted to the right, the photo-detector 20A receives more light than the photo-detector 20C, since the photo-detector 20C is shaded by the encapsulant 4. Again the shaded region in FIG. 6D is illustrated by the reference numeral 30.

Thus, the side walls of the encapsulant 4 in the present example act as barriers that are positioned to shade one or more of the photo-detectors from light that is incident upon the integrated circuit from a respective direction. The directional light sensor comprising the array of photo-detectors 20 is thereby able to determine the direction of light that is incident upon integrated circuit by comparing an output (by way of example only a voltage or current) of at least two of the photo-detectors. In the example of FIG. 6, the comparison of the output signal from the photo-detectors 20A and 20C allows this determination.

Returning to FIG. 6A, it will be appreciated that the array of photo-detectors includes two further photo-detectors not shown in the cross-section of FIGS. 6B, 6C and 6D. These further photo-detectors can be operated in the same manner described above, to provide further information on the direction of the incident light. In principle, any number of photo-detectors could be provided beneath the side walls of the encapsulant 4, to improve the accuracy by which the direction of the incident light relative to the surface normal of the major surface of the substrate can be determined.

In the examples described above in relation to FIGS. 4, 5 and 6, the barriers, which shade the photo-detectors 20, are formed using the edges of an opening in an encapsulant that partially covers a major surface of the substrate. However, it is envisaged that the barriers can also be formed by alternative means. A number of further examples will now be described.

Instead of placing the photo-detectors beneath portions of encapsulant on the major surface of the substrate 2, in an alternative embodiment, the barriers positioned to shade one or more of the photo-detectors from light incident upon the integrated circuit may be constructed in the form of metal features provided in a metallization stack that is located on the major surface of the substrate 2.

Metallization techniques are well established and easily controllable, such that their use to form the barriers of the kind described herein is highly controllable, allowing a significant degree of freedom in the design process. While the photo-detectors are typically located on the major surface of the substrate, the metallization stack can be grown above the major surface, thereby to locate the barriers directly above the photo-detectors.

Figure 9A:
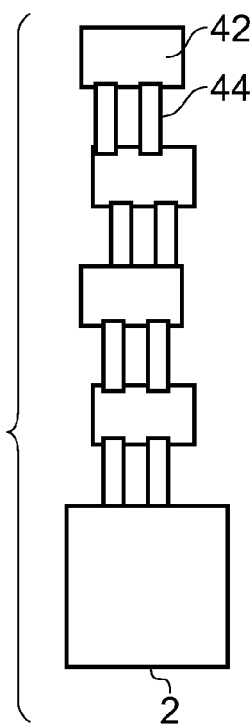
FIGS. 9A, 9B, 9C, 9D and 9E illustrate the forming of barriers using metal features in a metallization stack, in accordance with embodiments of the invention.

Examples of the way in which barriers may be formed using a metallization stack are illustrated in FIGS. 9A-9E. As shown in FIG. 9A, the metallization stack can typically include one or more patterned metal layers 42 separated by one or more via levels incorporating vias 44. Typical materials for the metal layers 42 and associated vias 44 include Al, Cu and W.

Figure 9B:
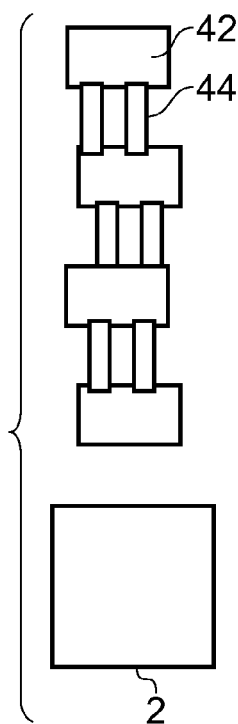
Figure 9C:
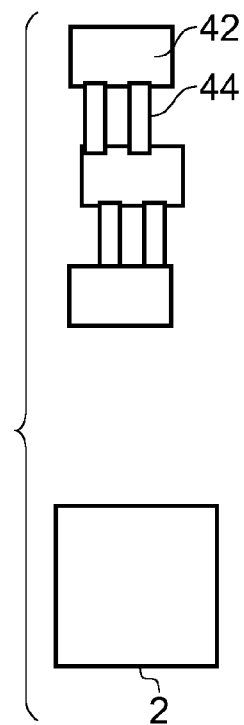
Figure 9D:
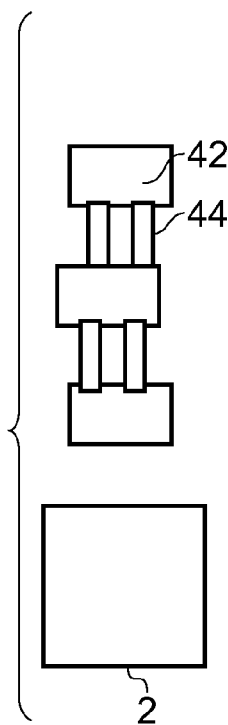
Figure 9E:
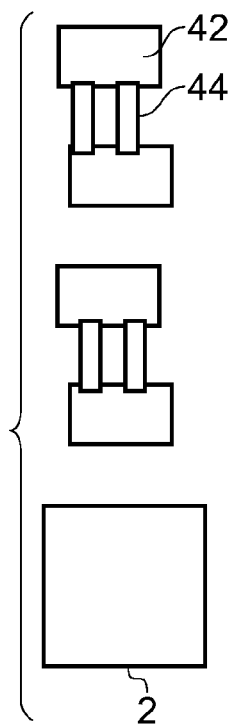

In the example of FIG. 9A, the barrier includes a series of metal features provided in metal layers 42 that are stacked substantially vertically and that are separated by a series of vias 44. However, it is envisaged that the barrier may take a number of alternative configurations. For example, as illustrated in FIGS. 9B and 9E, it is not necessary to provide vias 44 in between each and every metal level 42. Also, the vertical height and location of the barrier with respect to the major surface of the substrate 2 can be tailored by including or omitting one or more metal levels and/or vias 44 as illustrated in FIGS. 9C and 9D. It will be clear to the skilled person regarding FIG. 9 that a high degree of design flexibility is possible.

Figure 7:
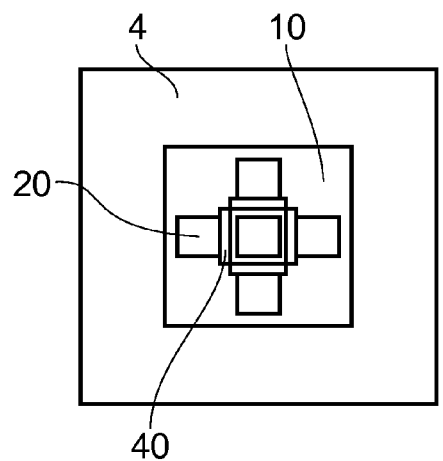
FIG. 7 shows an integrated circuit according to another embodiment of the invention.

Turning now to FIG. 7, a first example of an integrated circuit in which the barriers are provided using metal features in a metallization stack will now be described. In the example of FIG. 7, the integrated circuit can include an optional encapsulant 4 enclosing the semiconductor substrate 2. A region 10 on a major surface of the substrate incorporates one or more of the photo-detectors provided in an array similar to that described above. It will be noted that the photo-detectors 20 in this example are provided in a position such that they are all completely exposed by the opening in the encapsulant 4 (none of the photo-detectors lie partially beneath the encapsulant 4). In the present example, four barriers 40 are provided; each is located adjacent a respective peripheral photo-detector 4. In this manner, the barriers 40 each are positioned to shade a respective photo-detector from light incident upon the integrated circuit from a respective direction. The operation of the integrated circuit showing at FIG. 7 is substantially the same as that described above in relation to FIG. 6.

Figure 8:
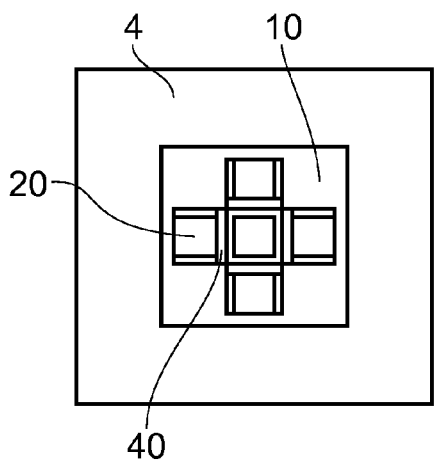
FIG. 8 shows an integrated circuit according to a further embodiment of the invention.

A further example is shown in FIG. 8, in which the barriers 40 are provided to at least partially surround their respective photo-detectors 20. In particular, in the present example, each peripheral photo-detector 20 is surrounded on three sides by a respective barrier. This partial enclosure of each photo-detector improves the sensitivity of the directional light sensor.

Figure 10A:
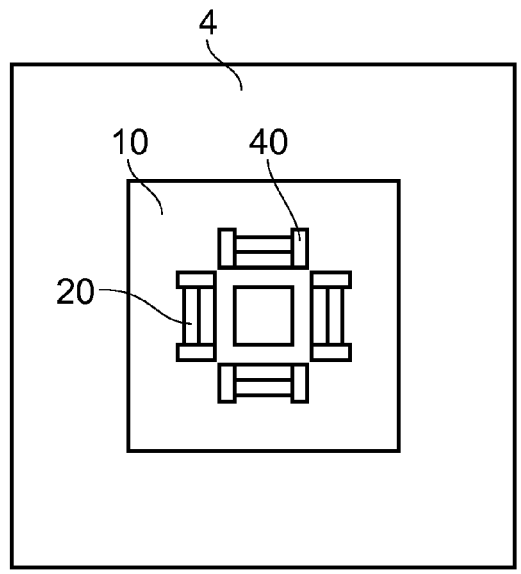
FIGS. 10A and 10B show an integrated circuit according to another embodiment of the invention.
Figure 10B:
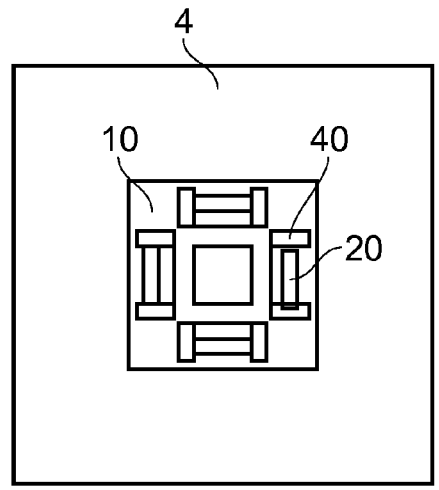

FIG. 10A and FIG. 10B illustrate that the shape and configuration of the photo-detectors 20 can themselves be tailored for use with a particular configuration in the barriers 40 provided. Particularly, in FIG. 10A it is illustrated that some of the photo-detectors 20 are substantially smaller than those shown in FIGS. 7 and 8. The configuration of the barriers 40 in FIG. 10A is analogous to that illustrated above in relation to FIG. 8. The higher aspect ratio of the peripheral photo-detectors 20 illustrated in FIG. 10 makes them more susceptible to shading by the barriers 40. This can increase sensitivity of the directional light sensor whereby a high degree of accuracy can be achieved during measurements of incident light direction.

Moreover, the configuration shown at FIG. 10A allows the size of the region 10 on the major surface of the substrate 2 to be reduced. This is illustrated in FIG. 10B, in which the same photo-detector arrangement is provided in an integrated circuit having a substantially smaller opening in the encapsulant 4. In principle, this can allow for the provision of a smaller substrate 2. In principal, the smaller dimensions of the opening in the encapsulant 4 can also provide better shading for light sensitive features such as an embedded memory as will be described in more detail below in relation to FIGS. 18-20.

Figure 11:
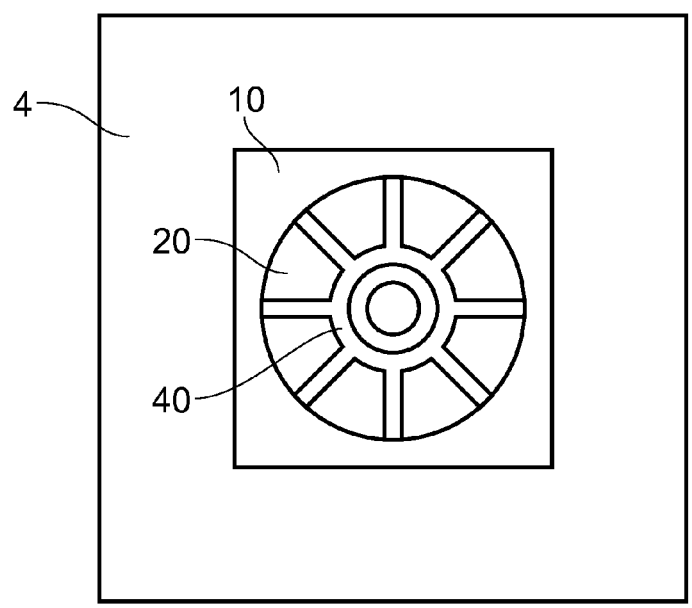
FIG. 11 shows an integrated circuit according to a further embodiment of the invention.

A further example of an integrated circuit in accordance with an embodiment of the invention is illustrated in FIG. 11. This example again illustrates the high degree of design freedom available when forming barriers using the features of a metallization stack. In FIG. 11, the integrated circuit again includes an optional encapsulant 4 having an opening that allows access of incident light to a region 10 on a major surface of the substrate 2 on which a plurality of photo-detectors 20 are provided in an array. In this example, the array of photo-detectors 20 can include a substantially circular central photo-detector surrounded by a plurality of wedge-shaped peripheral photo-detectors 20. In the present example, eight peripheral photo-detectors 20 are provided. The barrier 40 in this example comprises a series of features formed from the metal features in a metallization stack as described above, laid out to form a substantially star-shaped barrier that surrounds each of the peripheral, wedge-shaped photo-detectors 20 on three sides, thereby partially enclosing each peripheral photo-detector. Where one is provided, the central photo-detector may be completely surrounded by the barrier.

In principle, any number of peripheral photo-detectors may be provided in an analogous configuration. The greater the number of photo-detectors provided, the higher the degree of sensitivity and directionality with which the directional light sensor is able to evaluate the direction of incident light with respect to the surface normal of the major surface of the substrate 2.

FIG. 12 illustrates the operation of an integrated circuit incorporating barriers formed from the features of a metallization stack. In particular, FIGS. 12B, 12C and 12D show cross-sectional views (along the line BB) of the integrated circuit illustrated in FIG. 12A (which is analogous to the integrated circuit of FIG. 10B).

The metallization stack in FIG. 12 is shown to include a plurality of metal features including metal layers separated by vias to form barriers 40. These barriers are located substantially adjacent their respective photo-detectors 20. Typically, the metallization stack forming the barriers 40 is grown on the major surface of the substrate 2 on which the photo-detectors 20 are provided. In this way, the barriers 20 can be configured to extend above the photo-detectors 20.

Figure 12A:
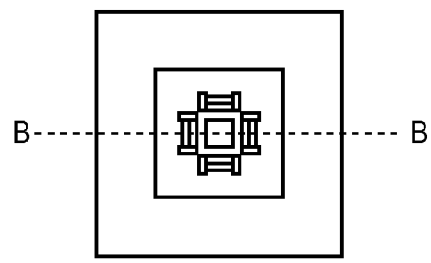
FIGS. 12A, 12B, 12C and 12D illustrate the operation of the directional light sensor in an integrated circuit of the kind described in relation to in FIGS. 7 to 11.
Figure 12B:
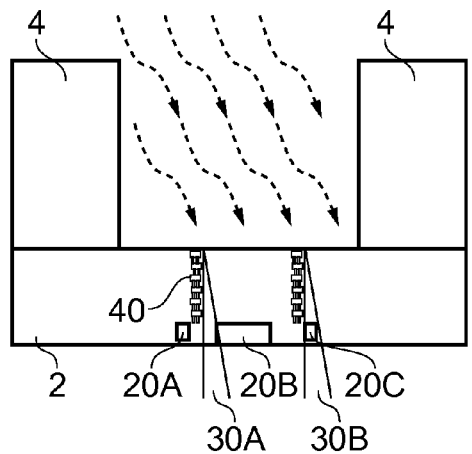
Figure 12C:
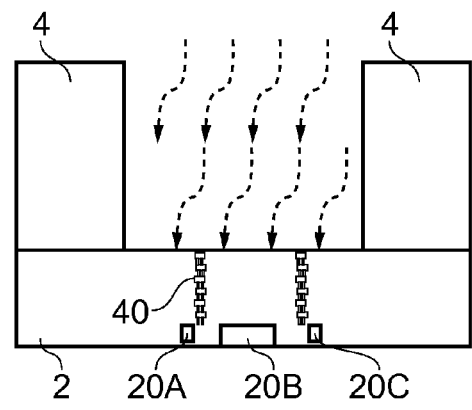
Figure 12D:
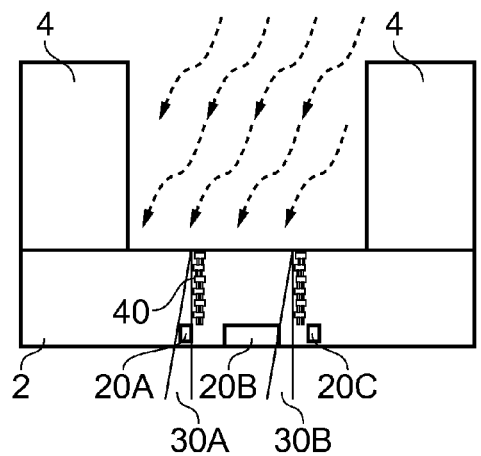

With reference to FIG. 12C, it can be seen that when light is incident on the integrated circuit from a direction corresponding substantially to the surface normal of the major surface of the substrate 2, the peripheral photo-detectors 20A and 20C each receive substantially the same amount of light. However, as described above in relation to FIG. 6, when light is incident from a direction tilted slightly to the left (see FIG. 12B) or to the right (see FIG. 12D), one of the two peripheral photo-detectors (20A, 20B) receives a larger amount of incident light than the other, since it is not shaded (see the shaded region 30A, 30B) by a respective barrier 40. In this way, comparison of an output signal of the peripheral photo-detectors 20A, 20B can be used to determine the direction of the incident light.

Figure 13:
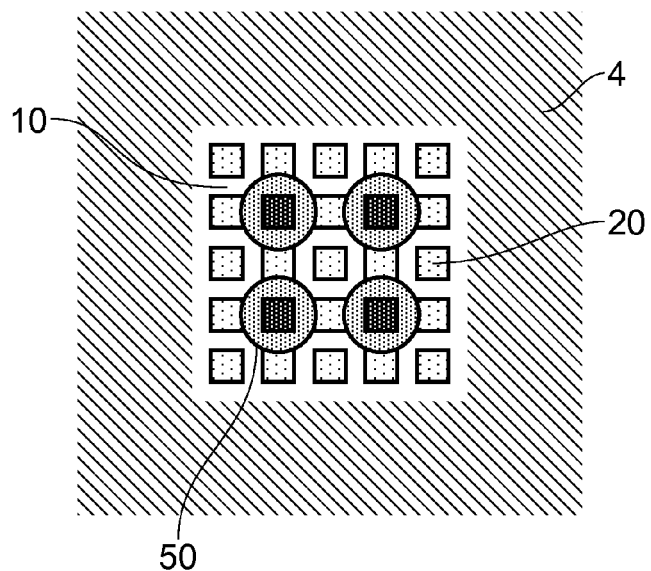
FIG. 13 shows an integrated circuit according to another embodiment of the invention.

FIG. 13 illustrates another integrated circuit in accordance with an embodiment of the invention. In this embodiment, the barrier 50 is located above the photo-detectors in the form of a patterned metal layer that overlays the array. The patterned metal layer can, in a manner similar to that described above, be formed using standard metallization techniques.

Figure 14A:
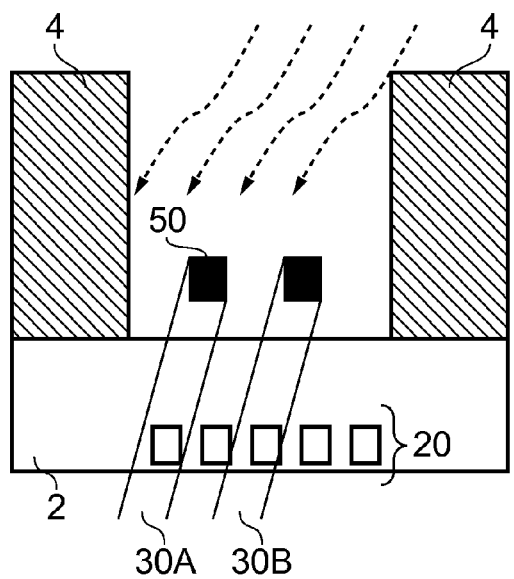
FIGS. 14A and 14B illustrate the operation of the directional light sensor in an integrated circuit of the kind shown in FIG. 13.

In this example the barrier 50 includes an array of four circular metal features, while the photo-detectors are arranged in a 5×5 array. As illustrated in FIG. 14, the operational principle of the integrated circuit is substantially the same as that described above. In particular, the array of barriers 50 overlying the array of photo-detectors 20 acts to shade at least some of the photo-detectors 20. The particular photo-detectors that are shaded, and the degree to which they are shaded, depends upon the direction of incident light. By way of an example, in FIG. 14A, the barriers 50 shade the photo-detectors 30A and 30B while leaving the remaining photo-detectors relatively un-shaded. By comparing the output signals of the various photo-detectors, it is thereby in principle possible to determine the direction of the incident light.

Figure 14B:
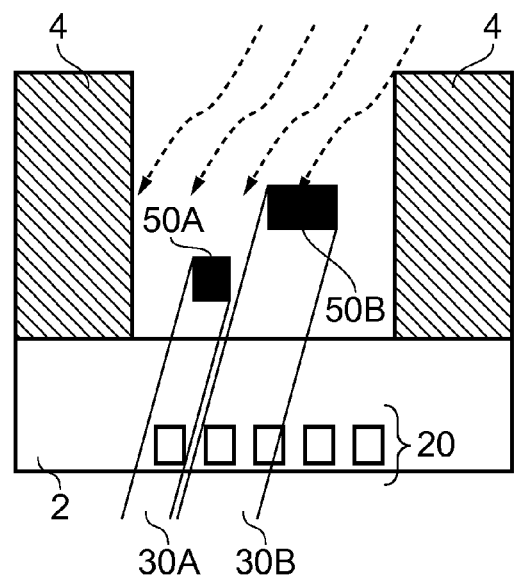

In FIG. 14A, the barriers 50 are provided in the same metal level and are thus an equal height above the photo-detectors 20. However, in another example of the high degree of design flexibility afforded by the use of metal features in a metallization stack, in FIG. 14B it is illustrated that the barriers in the array can be provided at different levels. Thus, the barrier 50B in FIG. 14B is provided at a higher level than the barrier 50A. The barrier 50B is also somewhat wider than the barrier 50A. By varying the height, width and shape of the barriers in the array, numerous different barrier configurations can be arrived at. This is illustrated further in FIGS. 15-17.

Figure 15:
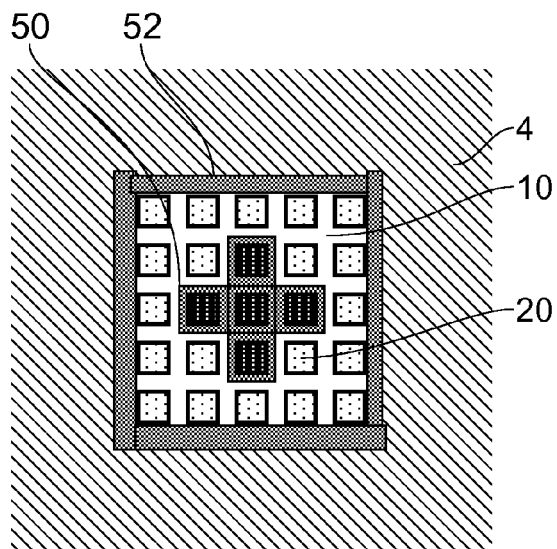
FIG. 15 shows an integrated circuit according to a further embodiment of the invention.
Figure 16:
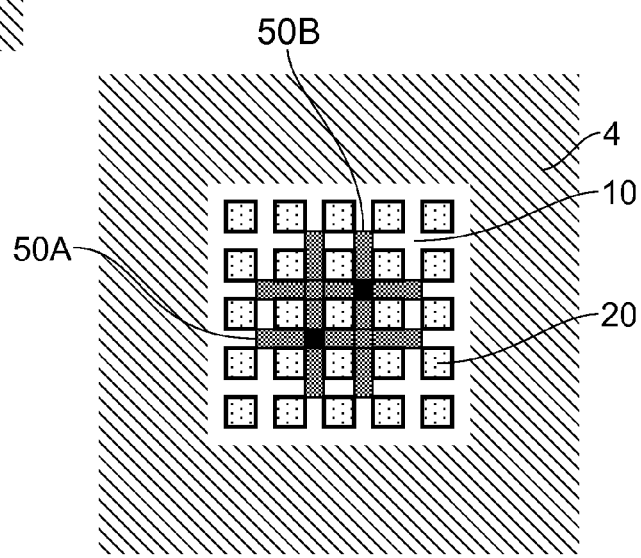
FIG. 16 shows an integrated circuit according to a another embodiment of the invention.
Figure 17:
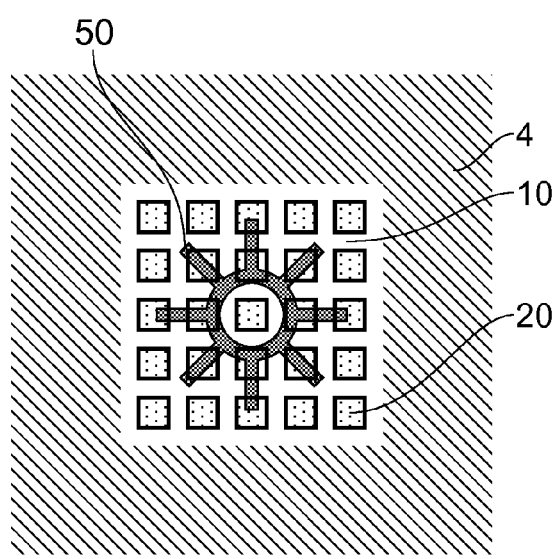
FIG. 17 shows an integrated circuit according to a further embodiment of the invention.

In each of FIGS. 15-17, the integrated circuit includes a square array of photo-detectors 20 in a 5×5 configuration. It will be appreciated that the size and layout of the photo-detector array can be varied in accordance with design requirements.

In FIG. 15, the barrier includes a peripheral barrier 52 adjacent each of the outer peripheral photo-detectors 20. This peripheral barrier 52 can act not only to shade the peripheral photo-detectors in the photo-detector array, but can also act to block light from entering beneath the encapsulant 4.

Additionally, the barrier array includes a '+' shaped barrier that is provided at the centre of the region 10. This central barrier can cover the central photo-detector and some of the other photo-detectors in the array surrounding the central photo-detector 20. The '+' shaped central barrier may be provided as a single piece, or may alternatively be provided using two straight sections oriented at 90° to each other, provided in separate levels of the metallization stack.

Similarly, in FIG. 16, two '+' central barriers are provided. Each barrier is provided in a separate metal level, although in principle they could be integrated into the same level. The two barriers overlie each other and also the photo-detector array to provide appropriate shading for various detectors in the array.

In FIG. 17, a substantially star-shaped barrier is provided. The barrier in this example is analogous to the shape of the barrier described above in relation to FIG. 11. However, in this example, the barrier overlays the photo-detector array.

In addition to the provision of photo-detectors in the region 10, further sensor types can also be provided in the integrated circuit, either in the region 10 (and therefore exposed to the surrounding environment) or, for example, beneath the encapsulant 4. Typically, sensors that require access to the surrounding environment can be provided in an opening in the encapsulant 4, while those that do not require such access (for example, a temperature sensor or an accelerometer) could be provided beneath the encapsulant 4. These sensors can be provided in a separate area in the opening 10 to the area occupied by the directional light sensor.

It will be appreciated that other features can be provided in the integrated circuit, in addition to the directional light sensor and other sensor types. For example, control circuitry could be provided at a position distal the region 10, typically beneath the encapsulant 4. Another example of a feature that may be provided is an embedded memory such as an MPT (multiple time programmable) memory array.

Embedded memory of this kind is typically sensitive to light. In particular, light incident upon the embedded memory can cause the memory to degrade and/or malfunction. For this reason, typically the memory would be provided beneath the encapsulant 4, distal the opening in the encapsulant 4. Typically, it is desirable to place the memory as far away from the opening in the encapsulant as possible, to provide a maximum amount of shielding against incident light. However, this design requirement is generally incompatible with an advantageous reduction in size typically desired in an integrated circuit of this kind. To place the memory a given distance away from the opening in the encapsulant, it is necessary to provide a substrate having a given size.

However, the barriers described herein can, in addition to providing shading for the photo-detectors in the photo-detector array of the directional light sensor, provide a degree of shading also for the memory. In principle, this can allow the memory to be placed closer to the opening in the encapsulant 4, thereby enabling a smaller substrate size. Examples of this are illustrated in FIGS. 18-21.

Figure 18A:
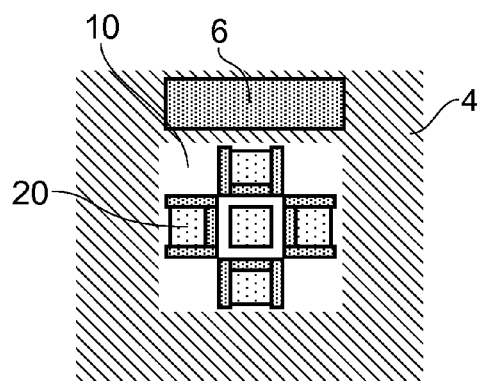
FIGS. 18A, 18B, 19A, 19B, 20A, 20B, 21A and 21B illustrate the use of barriers to shade non-volatile memory provided in an integrated circuit in accordance with embodiments of this invention.
Figure 18B:
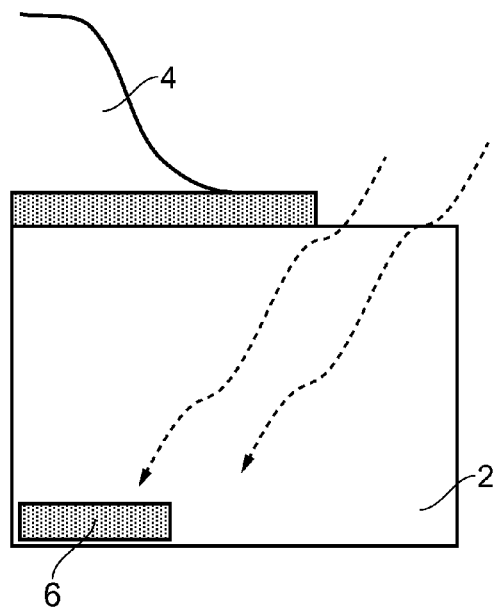
Figure 19A:
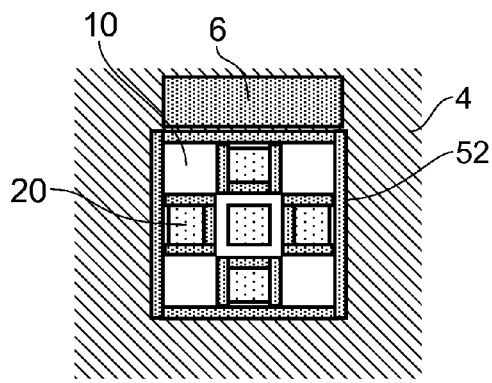
Figure 19B:
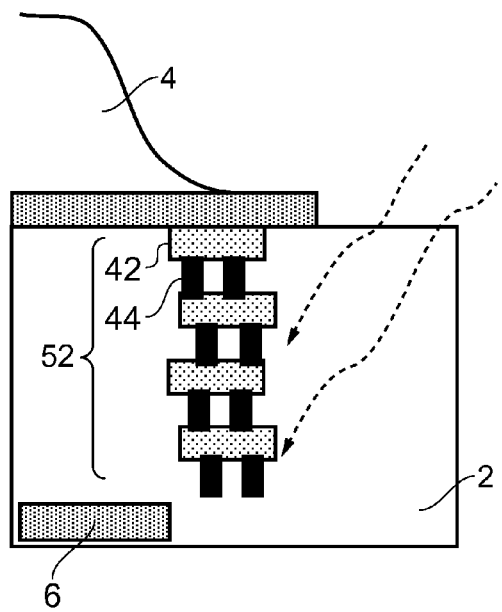

FIGS. 18A and 19A illustrate an integrated circuit similar to that described above in relation to FIG. 8. Cross-sectional views of these integrated circuit are shown in FIGS. 18B and 19B respectively.

As shown in FIG. 18B, although the memory 6 is provided beneath the encapsulant 4, when light is incident upon the integrated circuit from a sufficiently shallow angle, it can pass beneath the encapsulant 4 and thereby still fall upon the memory 6. In contrast, in FIG. 19B, where a peripheral barrier 52 is provided, this light is substantially blocked from falling upon the memory 6. As shown in FIG. 19B, in the present example, the barrier 52 is formed using the features of metallization stack as described above.

Figure 20A:
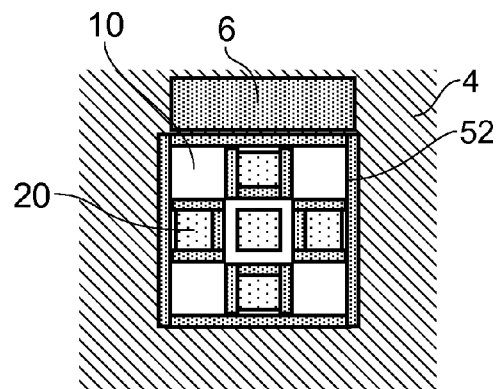
Figure 20B:
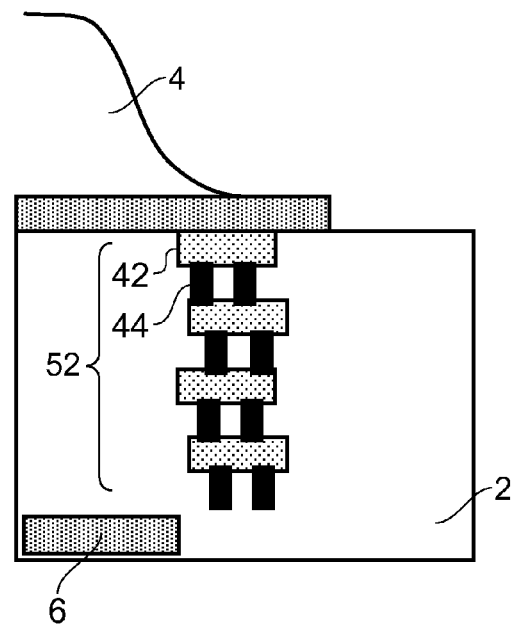
Figure 21A:
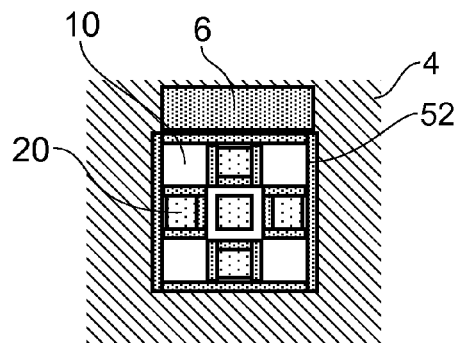

FIG. 20 and FIG. 21 illustrate that the features of the barrier 52 can be configured to allow the memory 6 to be located even closer to the opening in the encapsulant 4. In fact, in principle, the memory 6 could even be provided partially within the opening.

Figure 21B:
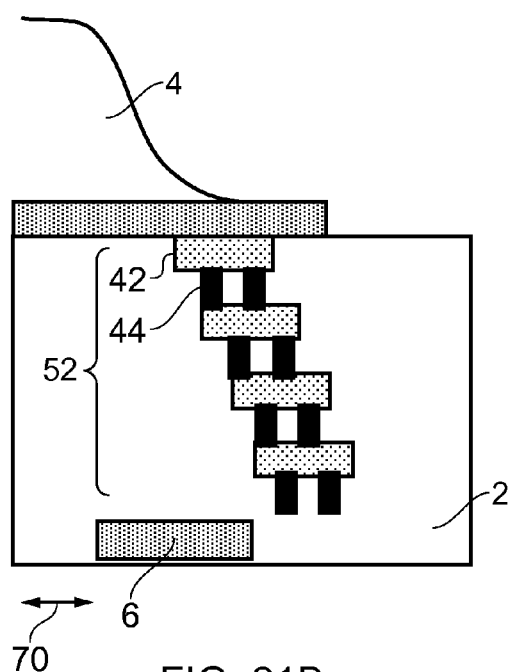

FIG. 20 illustrates substantially the same integrated circuit as that described above in relation to FIG. 19 for comparison purposes with adjacent FIG. 21. In FIG. 20, the barrier 52 comprises a substantially vertical barrier formed from metal features 42 and vias 44 in the metallization stack. In contrast, in FIG. 21B the metal features 42 and the vias 44 in the stack forming the barrier 52 are offset in adjacent metal levels, thereby to form a tilted barrier 52. In this way, the barrier 52 effectively shields the memory 6, even if the memory 6 is located at a closer position with respect to the opening in the encapsulant 4 than is shown in FIGS. 20A and 20B. This can allow a space saving illustrated by the arrow 70 in FIG. 21B, thereby leading to a smaller substrate 2.

Accordingly, there has been described an integrated circuit and a method of making the same. The integrated circuit includes a semiconductor substrate having a major surface. The integrated circuit also includes a directional light sensor. The directional light sensor includes a plurality of photodetectors located on the major surface. The directional light sensor also includes one or more barriers, wherein each barrier is positioned to shade one or more of the photodetectors from light incident upon the integrated circuit from a respective direction. The directional light sensor is operable to determine a direction of light incident upon the integrated circuit by comparing an output signal of at least two of the photodetectors.

Although particular embodiments of the invention have been described, it will be appreciated that many modifications/additions and/or substitutions may be made within the scope of the claimed invention.

The invention claimed is:

1. An integrated circuit comprising:
a semiconductor substrate having a major surface; and
a directional light sensor comprising:
   a plurality of photodetectors located on the major surface; and
   one or more barriers, wherein each barrier is positioned to shade one or more of the photodetectors from light incident upon the integrated circuit from a respective direction,
wherein the directional light sensor further comprises circuitry within the integrated circuit operable to determine a direction of light incident upon the integrated circuit by comparing an output signal of at least two of the photodetectors.

2. The integrated circuit of claim 1 comprising an encapsulant that covers the major surface, wherein the encapsulant has an opening therein which exposes a region of the major surface in which at least a portion of the directional light sensor is provided.

3. The integrated circuit of claim 2, wherein one or more of the barriers are formed by the edges of the opening in the encapsulant.

4. The integrated circuit of claim 3, wherein at least some of the photodetectors are positioned beneath the edges of the opening in the encapsulant so that at least a part of each said photodetector is located beneath the encapsulant.

5. The integrated circuit of claim 1, wherein at least some of the barriers comprise metal features formed in a metallization stack on the substrate.

6. The integrated circuit of claim 5, wherein one or more of the barriers comprise substantially vertical walls formed from metal features in the metallization stack.

7. The integrated circuit of claim 5, wherein one or more of the barriers comprise a patterned metal layer overlying the photodetectors on the major surface.

8. The integrated circuit of claim 7 comprising a plurality of said patterned metal layers, wherein each metal layer is provided in a different level of the metallization stack.

9. The integrated circuit of claim 1, wherein the photodetectors are arranged in a regular array comprising a central photodetector surrounded by a plurality of further photodetectors.

10. The integrated circuit of claim 9, wherein the further photodetectors have a smaller surface are than the central photodetector.

11. The integrated circuit of claim 1 further comprising non-volatile memory, wherein at least one of the barriers further acts to shade the non-volatile memory from light incident upon the integrated circuit.

12. A Radio Frequency Identification tag comprising the integrated circuit of claim 1.

13. A mobile communications device comprising the integrated circuit of claim 1.

14. A heating, ventilation and air conditioning (HVAC) system comprising one or more integrated circuits according to claim 1.

15. A method of making an integrated circuit, the method comprising:
  providing a semiconductor substrate having a major surface; and
  providing a directional light sensor in the integrated circuit by:
    forming a plurality of photodetectors on the major surface; and
    forming one or more barriers, wherein each barrier is positioned to shade one or more of the photodetectors from light incident upon the integrated circuit from a respective direction,
  wherein the directional light sensor is operable to determine a direction of light incident upon the integrated circuit by comparing an output signal of at least two of the photodetectors.

* * * * *